(12) United States Patent  (10) Patent No.: US 8,829,545 B2
Ueno et al.  (45) Date of Patent: Sep. 9, 2014

(54) GROUP III NITRIDE SEMICONDUCTOR LIGHT-EMITTING DEVICE

(75) Inventors: Masaki Ueno, Itami (JP); Takashi Kyono, Itami (JP); Yusuke Yoshizumi, Itami (JP)

(73) Assignee: Sumitomo Electric Industries, Ltd., Osaka-shi, Osaka (JP)

( * ) Notice: Subject to any disclaimer, the term of this patent is extended or adjusted under 35 U.S.C. 154(b) by 614 days.

(21) Appl. No.: 12/119,015

(22) Filed: May 12, 2008

(65) Prior Publication Data

US 2008/0315243 A1  Dec. 25, 2008

(30) Foreign Application Priority Data

Jun. 21, 2007 (JP) .................... P2007-164060

(51) Int. Cl.
*H01L 33/00* (2010.01)

(52) U.S. Cl.
USPC .. 257/97; 257/181; 257/E33.034; 257/E33.03

(58) Field of Classification Search
USPC ................................................ 257/97, 191
See application file for complete search history.

(56) References Cited

U.S. PATENT DOCUMENTS

| | | | |
|---|---|---|---|
| 5,563,422 A * | 10/1996 | Nakamura et al. ............ | 257/13 |
| 5,932,896 A * | 8/1999 | Sugiura et al. ............... | 257/94 |
| 6,337,493 B1 | 1/2002 | Tanizawa et al. | |
| 6,838,705 B1 * | 1/2005 | Tanizawa ..................... | 257/101 |
| 7,345,323 B2 * | 3/2008 | Goetz et al. ................. | 257/101 |
| 2005/0167693 A1 | 8/2005 | Goetz et al. | |

FOREIGN PATENT DOCUMENTS

| | | |
|---|---|---|
| CN | 1741296 | 3/2006 |
| EP | 0 959 540 | 11/1999 |
| EP | 1 387 453 | 2/2004 |
| EP | 1 630 878 | 3/2006 |
| JP | 8-330629 | 12/1996 |
| JP | 10-4210 | 1/1998 |
| JP | 11-330605 | 11/1999 |
| JP | 2002-231999 | 8/2002 |
| JP | 2003-332698 | 11/2003 |
| JP | 2006-93683 | 4/2006 |
| JP | 2007-95823 | 4/2007 |
| JP | 2007-116114 | 5/2007 |
| KR | 10-0267839 | 10/2000 |
| KR | 10-2005-0074918 | 7/2005 |
| KR | 10-2006-0132013 | 12/2006 |
| WO | WO 2007/034971 | 3/2007 |

* cited by examiner

*Primary Examiner* — Jerome Jackson, Jr.
(74) *Attorney, Agent, or Firm* — Drinker Biddle & Reath LLP

(57) ABSTRACT

A group III nitride semiconductor light-emitting device comprises an n-type gallium nitride-based semiconductor layer, a first p-type $Al_XGa_{1-X}N$ ($0 \leq X < 1$) layer, an active layer including an InGaN layer, a second p-type $Al_YGa_{1-Y}N$ ($0 \leq Y \leq X < 1$) layer, a third p-type $Al_ZGa_{1-Z}N$ layer ($0 \leq Z \leq Y \leq X < 1$), and a p-electrode in contact with the third p-type $Al_ZGa_{1-Z}N$ layer. The active layer is provided between the n-type gallium nitride-based semiconductor layer and the first p-type $Al_XGa_{1-X}N$ layer. The second p-type $Al_YGa_{1-Y}N$ ($0 \leq Y \leq X < 1$) layer is provided on the first p-type $Al_XGa_{1-X}N$ layer. The p-type dopant concentration of the second p-type $Al_YGa_{1-Y}N$ layer is greater than the p-type dopant concentration of the first p-type $Al_XGa_{1-X}N$ layer. The third p-type $Al_ZGa_{1-Z}N$ layer ($0 \leq Z \leq Y \leq X < 1$) is provided on the second p-type $Al_YGa_{1-Y}N$ layer. The p-type dopant concentration of the second p-type $Al_YGa_{1-Y}N$ layer is greater than a p-type dopant concentration of the third p-type $Al_ZGa_{1-Z}N$ layer.

18 Claims, 6 Drawing Sheets

GROUP III NITRIDE SEMICONDUCTOR LIGHT-EMITTING DEVICE

BACKGROUND OF THE INVENTION

1. Field of the Invention

The present invention relates to a group III nitride semiconductor light-emitting device.

2. Related Background Art

Patent Document 1 (Japanese Patent Application Publication Laid Open No. 8-330629) discloses a nitride semiconductor device. A positive electrode is in contact with a first p-type nitride semiconductor layer. A second p-type nitride semiconductor layer is disposed between a p-type cladding layer and the first p-type nitride semiconductor layer, and the p-type cladding layer, the second p-type nitride semiconductor layer, the first p-type nitride semiconductor layer are disposed in sequence on the active layer. The acceptor dopant concentration in the second p-type nitride semiconductor layer is lower than the acceptor dopant concentration in the first p-type nitride semiconductor layer, which is in contact with the positive electrode.

Patent Document 2 (Japanese Patent Application Publication Laid Open No. 10-4210) discloses a group III nitride semiconductor light-emitting device. On an active layer, a p-type $Al_{0.08}Ga_{0.92}N$ cladding layer, a p-type first GaN contact layer, and $p^+$-type second GaN contact layer are provided in sequence, and the $p^+$-type second GaN contact layer is in contact with an electrode.

SUMMARY OF THE INVENTION

In the light-emitting devices disclosed in Documents 1 and 2, a semiconductor layer stack including a p-type AlGaN electron blocking layer and a p-type GaN contact layer is provided on an active layer. The p-type GaN contact layer includes a p-type GaN layer with a relatively lower Mg concentration and a p-type GaN layer with a relatively higher Mg concentration.

What is needed for light-emitting diodes having such a structure is to enhance optical output. In the inventor's investigation of characteristics of a light-emitting diode, donor levels are observed in the vicinity of the interface between the p-type semiconductor layer and the active layer of a quantum well structure. An electro luminescence spectrum observed at a low temperature has a number of peaks, one of which is associated with the active layer and another of which is associated with a p-type semiconductor layer. One of possible reasons for this emission spectrum is as follows. Donor defects are formed in the vicinity of the interface between the active layer of the quantum well structure and the p-type semiconductor layer, and these defects lower the barrier height of the electron blocking layer. This lowering of the barrier height leads to leakage of electrons from the active layer to the p-type semiconductor region, resulting in decrease in emission efficiency.

It is an object of the present invention is to provide a group III nitride semiconductor light-emitting device which can reduce leakage of electrons from an active layer to a p-type semiconductor region.

According to one aspect of the present invention, a group III nitride semiconductor light-emitting device includes (a) an n-type gallium nitride-based semiconductor layer, (b) a first p-type $Al_XGa_{1-X}N$ (0≤X<1) layer, (c) an active layer including an InGaN layer, (d) a second p-type $Al_YGa_{1-Y}N$ (0≤Y≤X<1) layer provided on the first p-type $Al_XGa_{1-X}N$ layer, (e) a third p-type $Al_ZGa_{1-Z}N$ layer (0≤Z≤Y≤X<1) provided on the second p-type $Al_YGa_{1-Y}N$ layer, (f) a p-electrode in contact with the third p-type $Al_ZGa_{1-Z}N$ layer. The active layer is provided between the n-type gallium nitride-based semiconductor layer and the first p-type $Al_XGa_{1-X}N$ layer. The p-type dopant concentration of the second p-type $Al_YGa_{1-Y}N$ layer is greater than that of the first p-type $Al_XGa_{1-X}N$ layer and is greater than that of the third p-type $Al_ZGa_{1-Z}N$ layer.

In this group III nitride semiconductor light-emitting device, the first p-type $Al_XGa_{1-X}N$ layer is made of GaN or AlGaN. Further, the second p-type $Al_YGa_{1-Y}N$ layer is made of GaN or AlGaN. Furthermore, the third p-type $Al_ZGa_{1-Z}N$ layer is made of GaN or AlGaN.

In the group III nitride semiconductor light-emitting device of the present invention, it is preferable that the concentration of the p-type dopant in the second p-type $Al_YGa_{1-Y}N$ layer be $1\times10^{20}$ $cm^{-3}$ or more.

In the group III nitride semiconductor light-emitting device of the present invention, it is preferable that the p-type dopant concentration of the third p-type $Al_ZGa_{1-Z}N$ layer be $1\times10^{19}$ $cm^{-3}$ or more. In the group III nitride semiconductor light-emitting device of the present invention, it is preferable that the p-type dopant concentration of the third p-type $Al_ZGa_{1-Z}N$ layer be $1\times10^{20}$ $cm^{-3}$ or less.

In the group III nitride semiconductor light-emitting device of the present invention, it is preferable that the concentration of the p-type dopant in the first p-type $Al_YGa_{1-Y}N$ layer be $1\times10^{20}$ $cm^{-3}$ or less.

In the group III nitride semiconductor light-emitting device of the present invention, the second p-type $Al_YGa_{1-Y}N$ layer is in contact with the first p-type $Al_XGa_{1-X}N$ layer, and the third p-type $Al_ZGa_{1-Z}N$ layer is in contact with the second p-type $Al_YGa_{1-Y}N$ layer.

In the group III nitride semiconductor light-emitting device of the present invention, it is preferable that the second p-type $Al_YGa_{1-Y}N$ layer be made of GaN. In addition, in the group III nitride semiconductor light-emitting device of the present invention, it is preferable that the third p-type $Al_ZGa_{1-Z}N$ layer be made of GaN.

In the group III nitride semiconductor light-emitting device of the present invention, it is preferable that the first p-type $Al_XGa_{1-X}N$ layer be made of GaN.

In the group III nitride semiconductor light-emitting device of the present invention, the p-type dopant in the first p-type $Al_XGa_{1-X}N$ layer may be at least one of Be, Mg, and Zn. The p-type dopant in the second p-type $Al_YGa_{1-Y}N$ layer may be at least one of Be, Mg, and Zn. The p-type dopant in the third p-type $Al_ZGa_{1-Z}N$ layer may be at least one of Be, Mg, and Zn.

BRIEF DESCRIPTION OF THE DRAWINGS

The above object and other objects, features, and advantages of the present invention will be understood easily from the following detailed description of the preferred embodiments of the present invention with reference to the accompanying drawings.

DETAILED DESCRIPTION OF THE PREFERRED EMBODIMENTS

The teachings of the present invention will readily be understood in view of the following detailed description with reference to the accompanying drawings illustrated by way of example. Referring to the accompanying drawings, embodiments of a group III nitride semiconductor light-emitting device according to the present invention will be explained. When possible, parts identical to each other will be referred to with symbols identical to each other.

Embodiment

Figure 1:
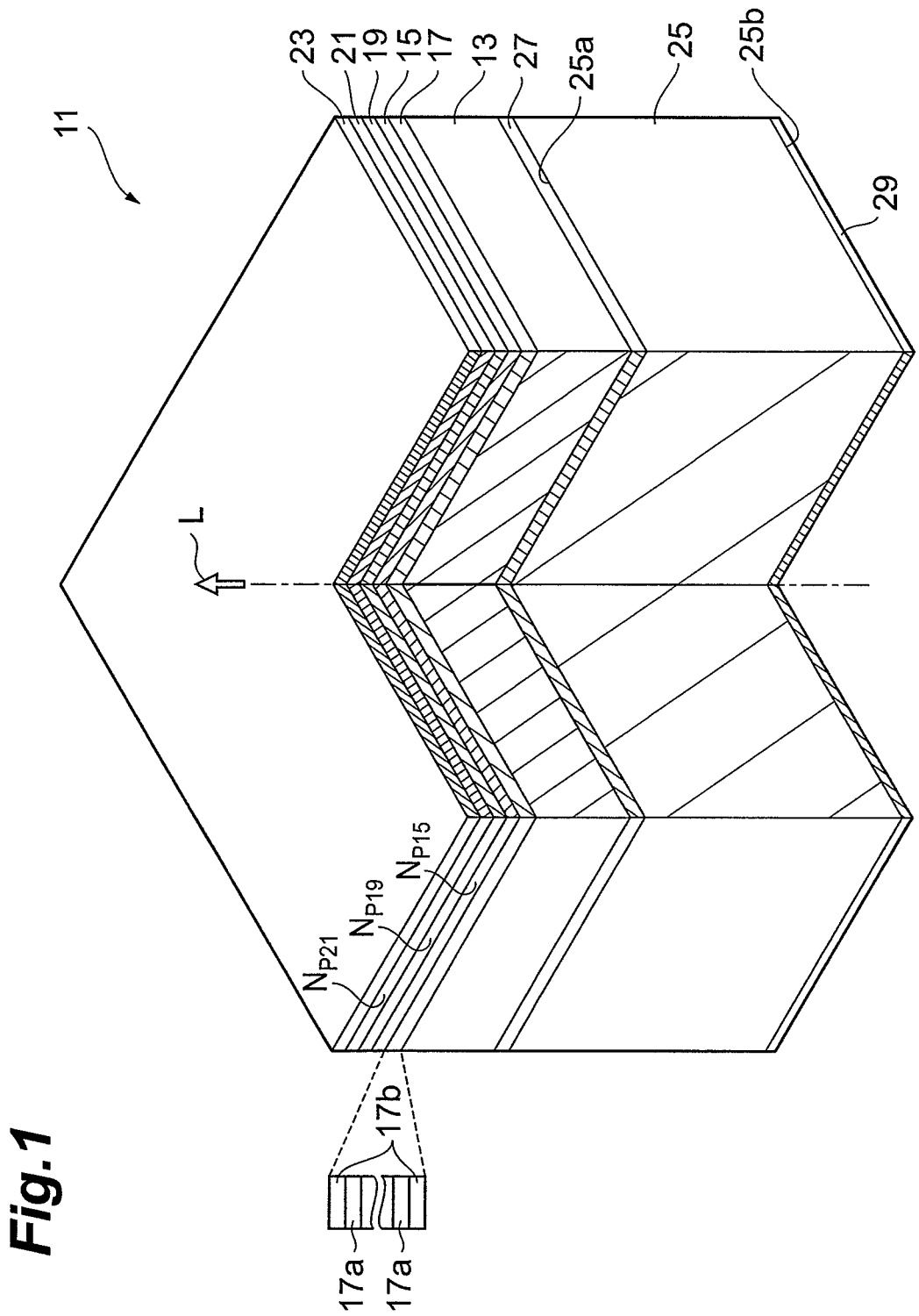
FIG. 1 is a schematic view illustrating a group III nitride semiconductor light-emitting device according to an embodiment of the present invention.

FIG. 1 schematically illustrates a group III nitride semiconductor light-emitting device according to the present embodiment. An exemplary group III nitride semiconductor light-emitting device 11 is a surface emission type light-emitting diode. This group III nitride semiconductor light-emitting device 11 includes an n-type gallium nitride-based semiconductor layer 13, a first p-type $Al_XGa_{1-X}N$ ($0 \leq X < 1$) layer 15, an active layer 17 including an InGaN layer, a second p-type $Al_YGa_{1-Y}N$ ($0 \leq Y \leq X < 1$) layer 19, a third p-type $Al_ZGa_{1-Z}N$ ($0 \leq Z \leq Y \leq X < 1$) layer 21, and an electrode 23. The first p-type $Al_XGa_{1-X}N$ layer (hereinafter, referred to as "p-type $Al_XGa_{1-X}N$ layer") 15 is provided on the InGaN active layer 17. The second p-type $Al_YGa_{1-Y}N$ layer (hereinafter, referred to as "p-type $Al_YGa_{1-Y}N$ layer") 19 is provided on the p-type $Al_XGa_{1-X}N$ layer 15. The third p-type $Al_ZGa_{1-Z}N$ layer (hereinafter, referred to as "p-type $Al_ZGa_{1-Z}N$ layer") 21 is provided on the p-type $Al_YGa_{1-Y}N$ layer 19. The electrode 23 is in contact with the p-type $Al_ZGa_{1-Z}N$ layer 21, and works as, for example, an anode. It is preferable that this contact be an excellent ohmic contact. The concentration of p-type dopant "$N_{P19}$" in the p-type $Al_YGa_{1-Y}N$ layer 19 is higher than the concentration of p-type dopant "$N_{P15}$" in the p-type $Al_XGa_{1-X}N$ layer 15. Furthermore, the concentration of p-type dopant "$N_{P19}$" is higher than the concentration of p-type dopant "$N_{P21}$" in the p-type $Al_ZGa_{1-Z}N$ layer 21.

In this group III nitride semiconductor light-emitting device 11, since the concentration of p-type dopant "$N_{P19}$" is higher than the concentration of the p-type dopant "$N_{P15}$", the p-type dopant atoms in the p-type $Al_YGa_{1-Y}N$ layer 19 diffuses through the p-type $Al_XGa_{1-X}N$ layer 15 to the interface between the p-type $Al_XGa_{1-X}N$ layer 15 and the active layer 17 by thermal diffusion during the production process of the semiconductor light-emitting device 11. The profile of a p-type dopant concentration in the p-type $Al_XGa_{1-X}N$ layer 15 is made abrupt in the vicinity of the interface between the p-type $Al_XGa_{1-X}N$ layer 15 and the active layer 17, resulting in a reduction in electron leakage from the active layer 17 and thus an increase in emission efficiency. Since the concentration of the p-type dopant "$N_{P21}$" in the p-type AlGaN layer 21 does not depend on the concentration of p-type dopant "$N_{P19}$," appropriate ohmic contact can be provided between the electrode 23 and the p-type $Al_ZGa_{1-Z}N$ layer 21.

The group III nitride semiconductor light-emitting device 11 further includes a substrate 25. In this embodiment, the substrate 25 may be a group III nitride substrate, such as a conductive GaN substrate. Alternatively, the substrate 25 may be a sapphire substrate. On the primary surface 25a of the n-type GaN substrate, for example, an n-type AlGaN layer 27 is provided. The other surface 25b of the n-type GaN substrate is in contact with an electrode 29, such as a cathode.

The active layer 17 can be provided with a quantum well structure, for example, including an InGaN well layer 17a and a barrier layer 17b. The barrier layer 17b may be made of a gallium nitride semiconductor, for example, an InGaN semiconductor having an indium content less than that of the well layer 17a. Alternatively, the barrier layer 17b may be made of GaN in some cases. The active layer 17 can be made of a structure of a single InGaN layer, in addition a single quantum well structure or a multiple quantum well structure may be used as well. Light "L" from the active layer 17 is emitted through the electrode 23.

In the group III nitride semiconductor light-emitting device 11, the p-type dopant for the p-type $Al_YGa_{1-Y}N$ layer 19 may be at least one of Be, Mg, and Zn. Use of these elements as p-type dopants ensures excellent performance of the device. The p-type dopant for the p-type $Al_ZGa_{1-Z}N$ layer 21 may be at least one of Be, Mg, and Zn. These elements make contact resistance low. The dopant concentration can be controlled by modifying a growth rate, for example. The p-type dopant for the p-type $Al_XGa_{1-X}N$ layer 15 may be at least one of Be, Mg, and Zn.

EXAMPLE

Light-emitting diodes (LEDs) were fabricated. N-type GaN substrates were prepared. In the subsequent crystal growth, organometallic vapor phase epitaxy (OMVPE) was used. Raw materials used in the OMVPE were as follows: trimethyl gallium (TMGa) as a gallium source, trimethylindium (TMIn) as an indium source, trimethylaluminum (TMAl) as an aluminum source, and ammonia as a nitrogen source. Hydrogen and nitrogen were used as carrier gases. Bis-cyclopentadienyl magnesium ($Cp_2Mg$) was used as a p-type dopant source, and monomethyl silane ($CH_3SiH_3$) was used as a n-type dopant source.

On the n-type GaN substrate, the following layers were deposited in sequence to form an epitaxial wafer "A" in the present example: an n-type $Al_{0.07}Ga_{0.93}N$ layer (for example, 50 nm thick); an n-type GaN layer (for example, 2 μm thick); an active layer including $In_{0.14}Ga_{0.86}N$ well layers (for example, 3 nm thick) and $In_{0.003}Ga_{0.997}N$ barrier layers (for example, 15 nm thick); a p-type $Al_{0.085}Ga_{0.915}N$ (for example, 20 nm thick, Mg concentration: $3.0 \times 10^{19}$ cm$^{-3}$); a GaN layer more heavily doped with Mg (for example, 20 nm thick, Mg concentration: $1.8 \times 10^{20}$ cm$^{-3}$); and a heavily Mg doped GaN layer (for example, 30 nm thick, Mg concentration: $7.6 \times 10^{19}$ cm-3). The active layer includes six well layers.

For the purpose of reference, an epitaxial wafer "R1" (hereinafter referred to as "Comparative Example 1") was formed by depositing a heavily Mg doped GaN layer (for example, 50 nm thick) without deposition of a GaN layer more heavily doped with Mg. An epitaxial wafer "R2" (hereinafter referred to as "Comparative Example 2") was formed by depositing a GaN layer more heavily doped with Mg (for example, 50 nm thick) without deposition of the heavily Mg doped GaN layer.

Figure 2:
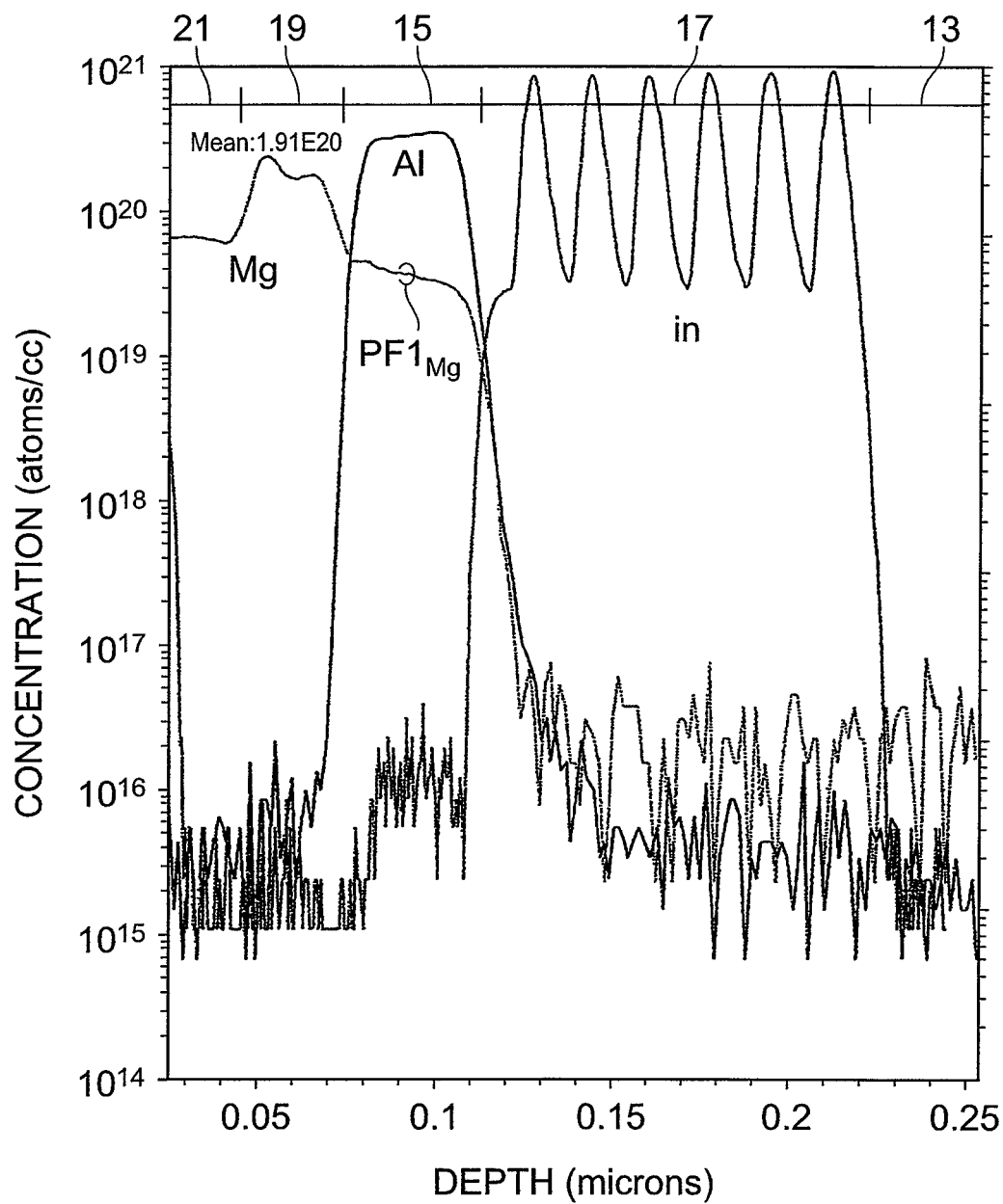
FIG. 2 is a graph illustrating the result of secondary ion mass spectrometry (SIMS) measurement of an epitaxial wafer "A"
Figure 3:
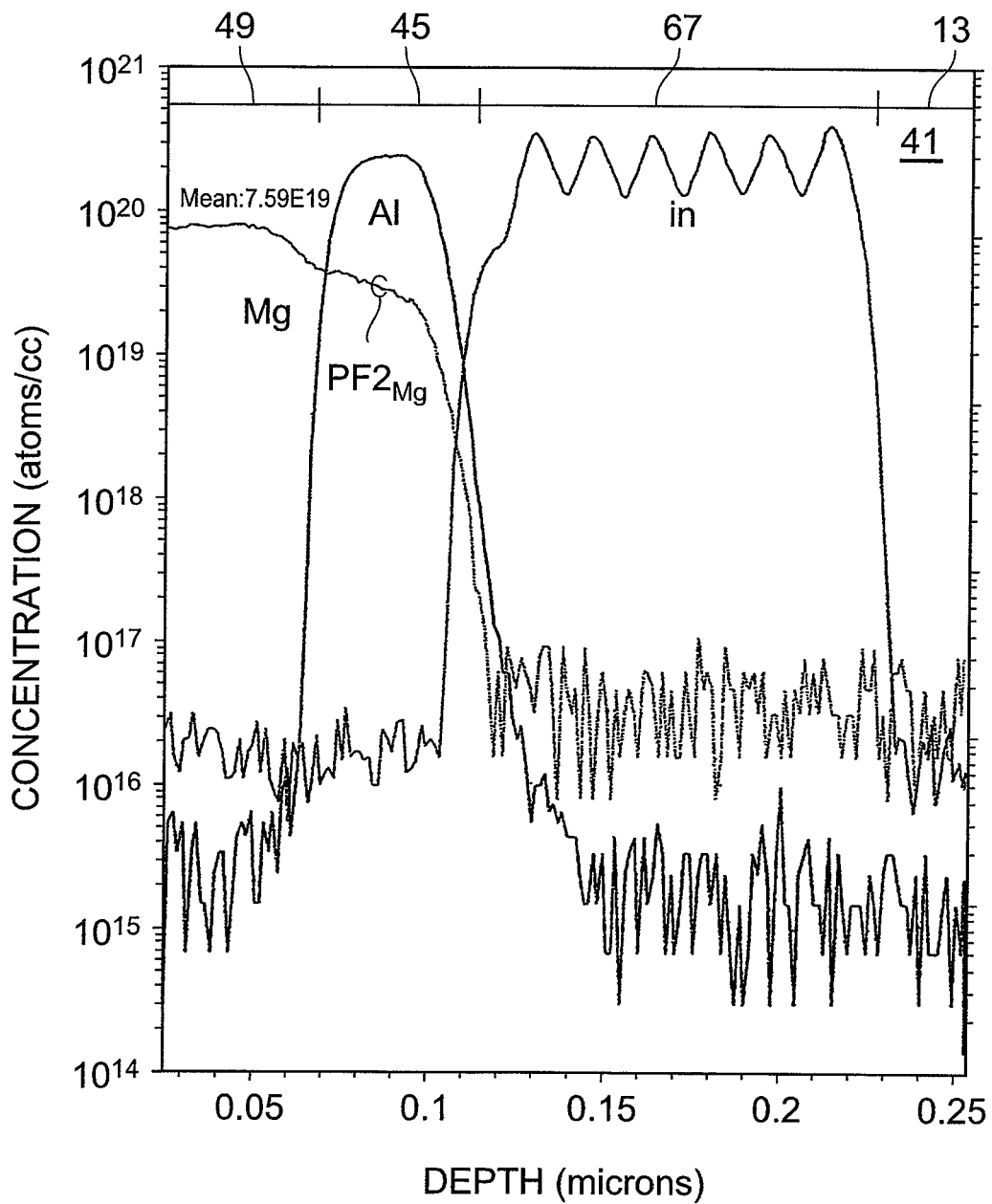
FIG. 3 is a graph illustrating the result of secondary ion mass spectrometry (SIMS) measurement of an epitaxial wafer "R"

FIG. 2 shows the profile of concentrations of constituent elements measured by secondary ion mass spectrometry (SIMS) of the epitaxial wafer "A." FIG. 3 shows the profile of concentrations of constituent elements measured by SIMS of the epitaxial wafer "R." With reference to FIG. 2, since the GaN layer more heavily doped with Mg (reference symbol 19 in FIG. 2) is provided between the p-type $Al_{0.085}Ga_{0.915}N$ layer (reference symbol 15 in FIG. 2) and the GaN layer heavily doped with Mg (reference symbol 21 in FIG. 2), the Mg concentration in the p-type $Al_{0.085}Ga_{0.915}N$ layer is 3-4×$10^{19}$ cm$^{-3}$ according to the Mg (p-type dopant) profile "$PF1_{Mg}$," and the steepness of the Mg profile Mg "$PF1_{Mg}$" is improved in the vicinity of the interface between the p-type $Al_{0.085}Ga_{0.915}N$ layer and the active layer (reference symbol 17 in FIG. 2). With reference to FIG. 3, the p-type $Al_{0.085}Ga_{0.915}N$ layer (reference symbol 45 in FIG. 3) is located between the active layer (reference symbol 17 in FIG. 3) and the heavily Mg doped GaN layer (reference symbol 49 in FIG. 3). The Mg concentration in the p-type $Al_{0.085}Ga_{0.915}N$ layer is 2-3×$10^{19}$ cm$^{-3}$ according to the Mg (p-type dopant) profile "$PF2_{Mg}$." In the vicinity of the interface between the p-type $Al_{0.085}Ga_{0.915}N$ layer (reference symbol 45 in FIG. 3) and the active layer (reference symbol 17 in FIG. 3), the abruptness of the Mg concentration change in the profile "$PF2_{Mg}$" is not superior to the profile "$PF1_{Mg}$" shown in FIG. 2. This difference in abruptness is more evident by comparison of the profile "$PF1_{Mg}$" or "$PF2_{Mg}$" with the profile of the Al concentration.

After taking out the epitaxial wafers "A", "R1" and "R2" from the reactor, an n-electrode (for example, Ti/Al electrode) was formed on the backside of the GaN substrate while a p-electrode (for example, Ni/Au electrode) was formed on the front surface of each epitaxial wafer, by vacuum evaporation and/or lithography. The size of the p-electrode was, for example, 400 μm square.

After pad electrodes were formed for the p-electrode and the n-electrode, a current of 20 mA was applied to the device on the substrate to measure the wavelength and optical output of light emitted from the device. The contact resistance was measured by a transmission line method (TLM). The Mg concentration was evaluated from the results of SIMS.
Sample Name: Structure of p-GaN layer: Optical output:
  Emission wavelength: Forward Voltage: Contact resistance
A: double layer of normal Mg conc./high Mg conc.: 5 mW: 468 nm: 3.3 V: 7E-3 Ωcm$^2$
R1: single layer of normal Mg conc.: 4 mW: 470 nm: 3.3 V: 7E-3 Ωcm$^2$
R2: single layer of high Mg conc.: 4.8 mW: 465 nm: 3.7 V: 8E-2 Ωcm$^2$
The forward voltage is defined as a value measured at an applied DC current of 20 mA.

The results show that the LED of "Example" exhibits a higher optical output, a lower driving voltage, and a lower contact resistance compared with two LEDs of "Comparative Examples." The LED of "Comparative Example 1" also exhibits a lower contact resistance and a forward voltage, but exhibits an optical output that is 20% lower than that of the LED of "Example." The LED of "Comparative Example 2" exhibits an optical output which is substantially comparable with that of the LED of "Example," but exhibits a higher contact resistance and a higher driving voltage compared with that of the LED of "Example."

Since the contact resistance of the p-electrode of an LED tends to increase as the Mg concentration excessively increases or decreases, it is preferable that the Mg concentration be 1×$10^{19}$ cm$^{-3}$ or more and that the Mg concentration be 1×$10^{20}$ cm$^{-3}$ or less. The change of the Mg concentration around the interface between the p-type AlGaN layer and the active layer in the SIMS profile becomes abrupt as the Mg concentration increases in the p-type GaN layer in direct contact with the p-type AlGaN layer. As the Mg concentration increases in the p-type GaN layer, magnesium atoms can be readily diffused into the active layer through the p-type AlGaN layer.

Figure 4:
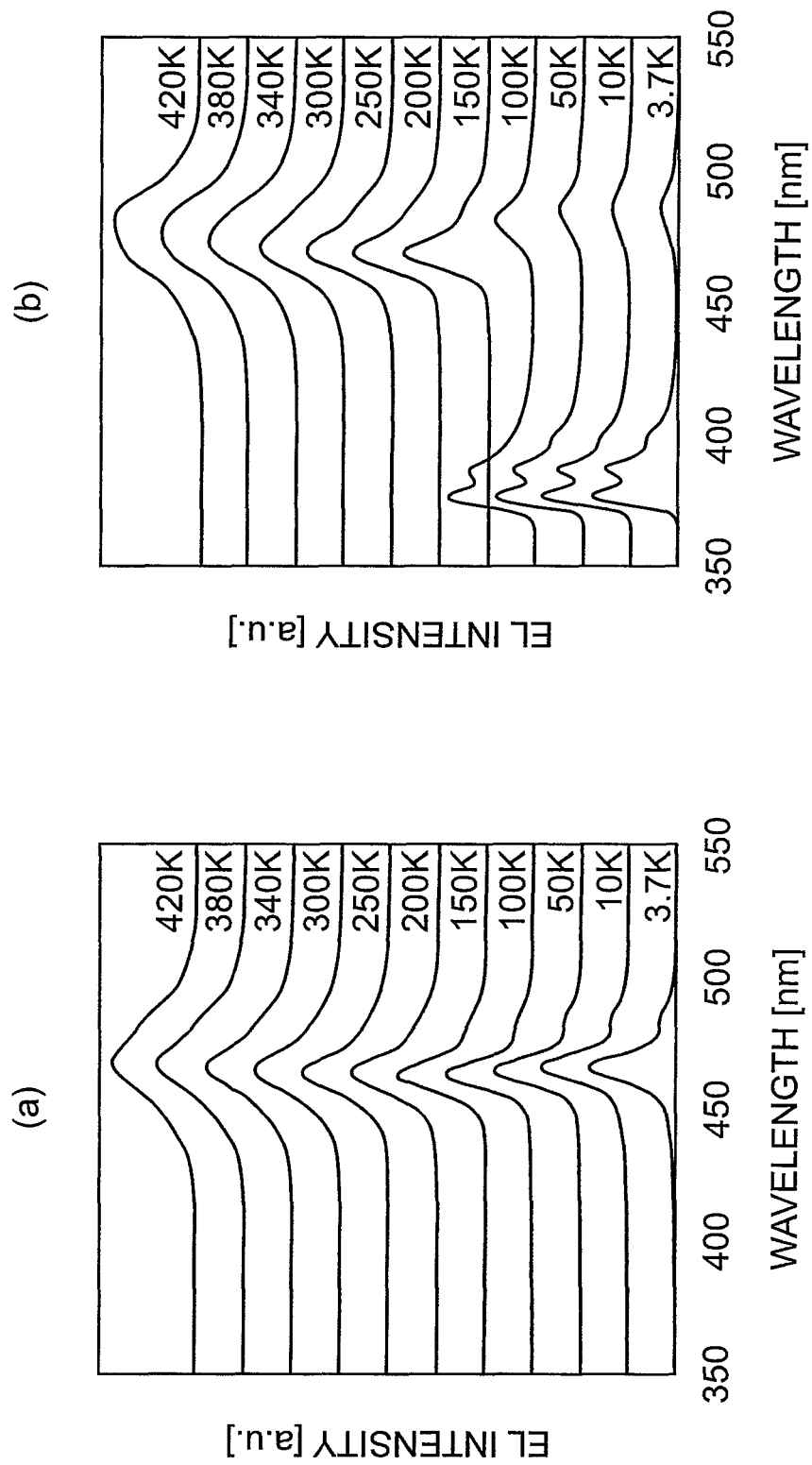
FIG. 4 is a view showing graphs of electro-luminescence spectra in "Example" and "Comparative Example 1"
Figure 5:
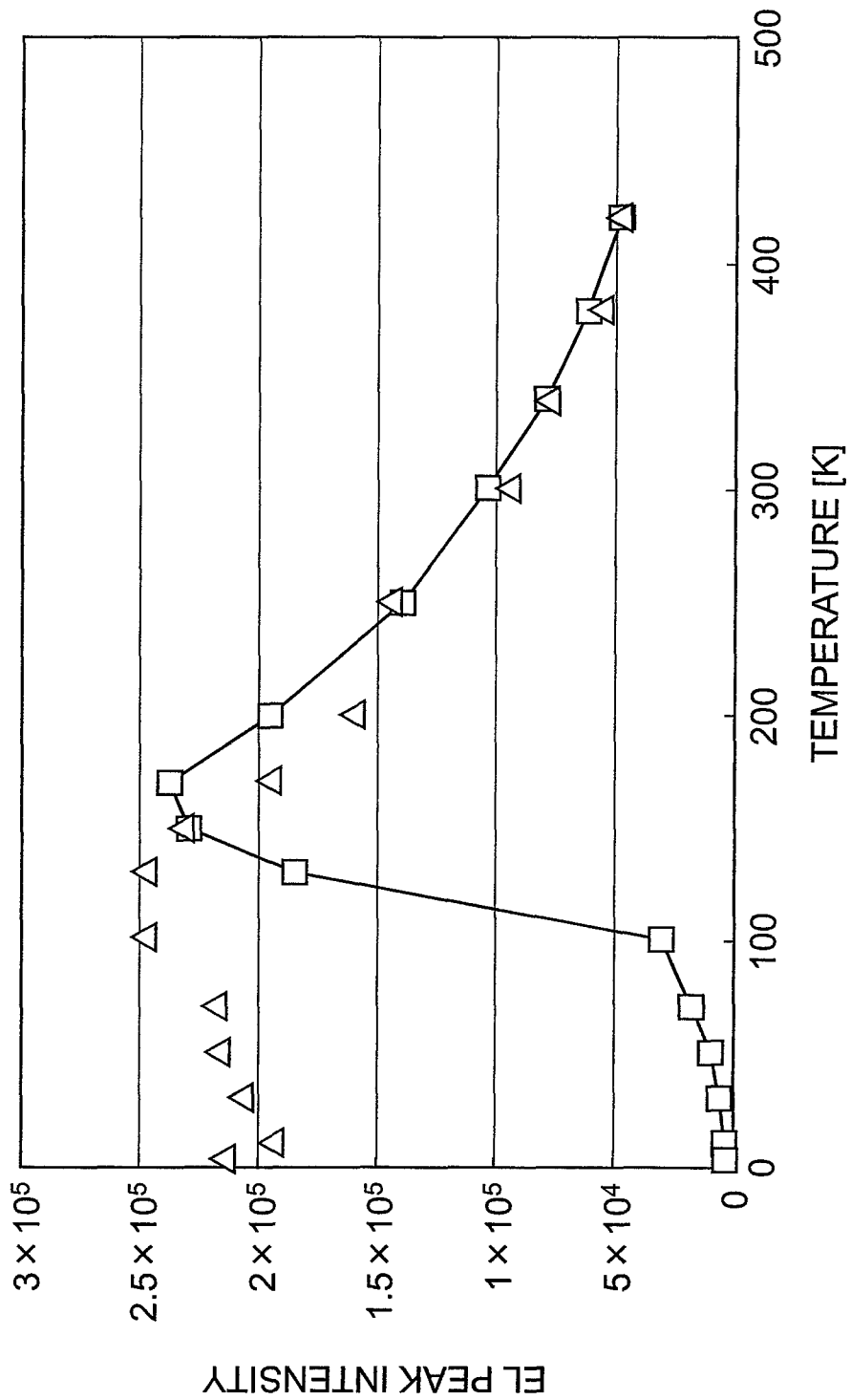
FIG. 5 is a graph of the emission intensity versus ambient temperature of active layers in "Example" and "Comparative Example 1"

While operating LEDs of "Comparative Examples 1 and 2" and "Example," the emission spectra of the LEDs were measured at the absolute temperature range of 10K to 420K using a cryostat. Part (a) of FIG. 4 shows EL spectra of "Example." Part (b) of FIG. 4 shows EL spectra of "Comparative Example 1." FIG. 5 is a graph illustrating the emission intensity versus ambient temperature of the active layers of "Example" (indicated by symbol "Δ" in the drawing) and "Comparative Example 1" (indicated by symbol "□" in the drawing). In "Comparative Example 1," an emission peak by donor/acceptor pairs in the p-type semiconductor layer is observed near 380 nm at lower temperatures. Since the emission efficiency by donor/acceptor pairs in the p-type semiconductor layer is enhanced at lower temperatures, the relevant peak corresponds to emission by electrons leaking from the active layer to the p-type semiconductor layer. On the other hand, since only the emission from the active layer near 460 nm is observed even at lower temperatures in "Example," this shows that electron leakage from the active layer to the p-type semiconductor layer is negligible small.

Figure 6:
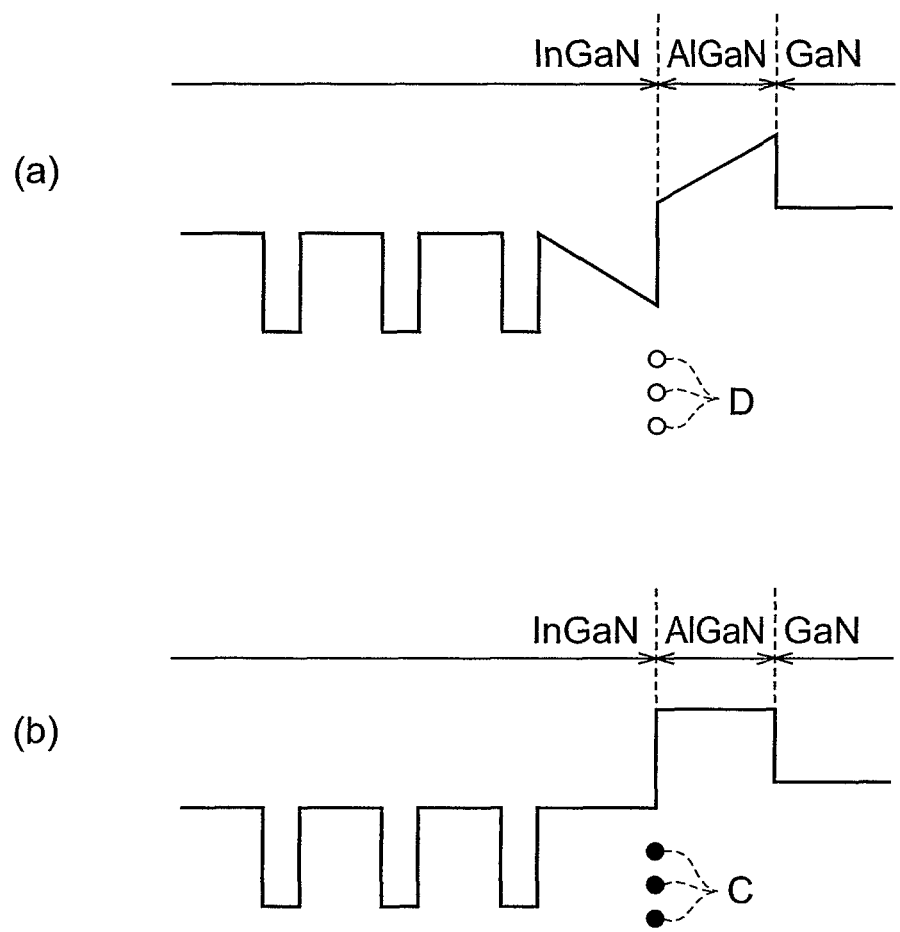
FIG. 6 is a view showing band diagrams of an active layer and a p-type semiconductor layer.

As shown in Part (a) of FIG. 6, the LED structure of "Comparative Example 1" has donor defects "D" at the interface between the p-type AlGaN and the active layer. These defects lower the barrier height of the p-type AlGaN layer. The barrier height decrease causes electron leakage.

The LED structure of "Comparative Example 1," which requires a high forward voltage, is not preferred regardless of high emission efficiency.

The LED structure of "Example" can control the Mg profile in the p-type AlGaN layer by use of the diffusion of Mg atoms from the GaN layer heavily doped with Mg, so as to achieve a steep change in the Mg concentration in the Mg profile and compensation "C" for donor defects, as shown in part (b) of FIG. 6. This leads to high emission efficiency in the LED of "Example." Furthermore, the p-type GaN layer is provided for low contact resistance to the electrode, independent of the control of the Mg profile. Accordingly, the LED of "Example" satisfies both of the low contact resistance to the p-type electrode and the compensation for donor defects.

As seen from the above description, in the group III nitride semiconductor light-emitting device 11, a concentration of the p-type dopant of 1×$10^{20}$ cm$^{-3}$ or more facilitates dopant diffusion. It is therefore preferable that the concentration of the p-type dopant "$N_{P19}$" in the p-type $Al_yGa_{1-y}N$ layer 19 be 1×$10^{20}$ cm$^{-3}$ or more. In addition, it is preferable that the concentration of the p-type dopant "$N_{P19}$" be 1.0×$10^{21}$ cm$^{-3}$ or less.

In the group III nitride semiconductor light-emitting device 11, in order to reduce the contact resistance in the p-type electrode, it is preferable that the concentration of the p-type dopant "$N_{P21}$" in the p-type $Al_ZGa_{1-Z}N$ layer 21 be 1×$10^{19}$ cm$^{-3}$ or more. In addition, in order to suppress the increase of the forward voltage (Vf), it is preferable that the concentration of the p-type dopant "$N_{P21}$" in the p-type $Al_ZGa_{1-Z}N$ layer 21 be 1×$10^{20}$ cm$^{-3}$ or less by avoiding addition of the p-type dopant in an excess amount.

In the group III nitride semiconductor light-emitting device 11, since an excess dopant concentration decreases the activation rate, it is preferable that the concentration of the p-type dopant $N_{P15}$ in the p-type $Al_yGa_{1-y}N$ layer 15, which supplies holes to the active layer, be 1×$10^{20}$ cm$^{-3}$ or less. Furthermore, it is preferable that the concentration of the p-type dopant "$N_{P15}$" be 1.0×$10^{19}$ cm$^{-3}$ or more.

In the group III nitride semiconductor light-emitting device 11, the p-type $Al_YGa_{1-Y}N$ layer 19 may be made of AlGaN or GaN. The p-type $Al_ZGa_{1-Z}N$ layer 21 may be made of AlGaN or GaN as well.

It is preferable that both the p-type $Al_YGa_{1-Y}N$ layer 19 and the p-type $Al_ZGa_{1-Z}N$ layer 21 be made of GaN. GaN can be grown at a high growth rate, and thus can reduce the growth time and manufacturing cost. In addition, the activation rate of the acceptor in GaN is high, which results in low contact resistance and low specific resistance.

In the group III nitride semiconductor light-emitting device 11, it is preferable that the p-type $Al_YGa_{1-Y}N$ layer 19 be made of AlGaN and the p-type $Al_ZGa_{1-Z}N$ layer 21 be made of GaN. Since AlGaN is deposited at a lower growth rate, the Mg fraction in raw materials supplied to the reactor can be readily increased. This results in increase in the Mg concentration of AlGaN.

In the group III nitride semiconductor light-emitting device 11, the material for the p-type $Al_XGa_{1-X}N$ layer 15 is not limited to AlGaN, and GaN can also be used. GaN can be used as an electron blocking layer, depending on the emission wavelength in the active layer.

Having described and illustrated the principle of the invention in a preferred embodiment thereof, it is appreciated by those having skill in the art that the invention can be modified in arrangement and detail without departing from such principles. Details of devices and steps of the method can be modified as necessary. We therefore claim all modifications and variations coming within the spirit and scope of the following claims.

What is claimed is:

1. A group III nitride semiconductor light-emitting device comprising:
an n-type gallium nitride-based semiconductor layer;
a first p-type $Al_XGa_{1-X}N$ (0≤x<1) layer;
an active layer including an InGaN layer, the active layer being provided between the n-type gallium nitride-based semiconductor layer and the first p-type $Al_XGa_{1-X}N$ layer, the active layer being in physical contact with the first p-type $Al_XGa_{1-X}N$ layer;
a second p-type $Al_YGa_{1-Y}N$ (0≤Y≤x<1) layer provided on the first p-type $Al_XGa_{1-X}N$ layer, a p-type dopant concentration of the second p-type $Al_YGa_{1-Y}N$ layer being greater than a p-type dopant concentration of the first p-type $Al_XGa_{1-X}N$ layer, the second p-type $Al_YGa_{1-Y}N$ layer being in physical contact with the first p-type $Al_XGa_{1-X}N$ layer, the p-type dopant concentration of the first p-type $Al_XGa_{1-X}N$ layer continuously decreasing from the second p-type $Al_YGa_{1-Y}N$ layer to the active layer, a minimal p-type dopant concentration of the first p-type $Al_XGa_{1-X}N$ layer being at the interface between the first p-type $Al_XGa_{1-X}N$ layer and the active layer;
a third p-type $Al_ZGa_{1-Z}N$ layer (0≤z≤Y≤x<1) provided on the second p-type $Al_YGa_{1-Y}N$ layer, the p-type dopant concentration of the second p-type $Al_YGa_{1-Y}N$ layer being greater than a p-type dopant concentration of the third p-type $Al_ZGa_{1-Z}N$ layer; and
a p-electrode in physical contact with the third p-type $Al_ZGa_{1-Z}N$ layer.

2. The group III nitride semiconductor light-emitting device according to claim 1, wherein the p-type dopant concentration of the second p-type $Al_YGa_{1-Y}N$ layer is $1\times10^{20}$ $cm^{-3}$ or more.

3. The group III nitride semiconductor light-emitting device according to claim 1, wherein the p-type dopant concentration of the third p-type $Al_ZGa_{1-Z}N$ layer is in a range of $1\times10^{19}$ $cm^{-3}$ to $1\times10^{20}$ $cm^{-3}$.

4. The group III nitride semiconductor light-emitting device according to claim 1, wherein the p-type dopant concentration of the first p-type $Al_XGa_{1-X}N$ layer is $1\times10^{20}$ $cm^{-3}$ or less.

5. The group III nitride semiconductor light-emitting device according to claim 1, wherein the second p-type $Al_YGa_{1-Y}N$ layer is made of GaN.

6. The group III nitride semiconductor light-emitting device according to claim 1, wherein the first p-type $Al_XGa_{1-X}N$ layer is made of GaN.

7. The group III nitride semiconductor light-emitting device according to claim 1, wherein the third p-type $Al_ZGa_{1-Z}N$ layer is made of GaN.

8. The group III nitride semiconductor light-emitting device of claim 1, wherein the first p-type $Al_XGa_{1-X}N$ layer is doped with p-type dopant of at least one of Be, Mg, and Zn; the second p-type $Al_YGa_{1-Y}N$ layer is doped with p-type dopant of at least one of Be, Mg, and Zn; and the third p-type $Al_ZGa_{1-Z}N$ layer is doped with p-type dopant of at least one of Be, Mg, and Zn.

9. The group III nitride semiconductor light-emitting device according to claim 1, wherein the p-type dopant concentration of the second p-type $Al_YGa_{1-Y}N$ layer is $1\times10^{20}$ $cm^{-3}$ or more, and the p-type dopant concentration of the third p-type $Al_ZGa_{1-Z}N$ layer is in a range of $1\times10^{19}$ $cm^{-3}$ to $1\times10^{20}$ $cm^{-3}$.

10. The group III nitride semiconductor light-emitting device according to claim 1, wherein the p-type dopant concentration of the second p-type $Al_YGa_{1-Y}N$ layer is $1\times10^{20}$ $cm^{-3}$ or more, and the p-type dopant concentration of the first p-type $Al_XGa_{1-X}N$ layer is $1\times10^{20}$ $cm^{-3}$ or less.

11. The group III nitride semiconductor light-emitting device according to claim 1, wherein the p-type dopant concentration of the third p-type $Al_ZGa_{1-Z}N$ layer is in a range of $1\times10^{19}$ $cm^{-3}$ to $1\times10^{20}$ $cm^{-3}$, and the p-type dopant concentration of the first p-type $Al_XGa_{1-X}N$ layer is $1\times10^{20}$ $cm^{-3}$ or less.

12. The group III nitride semiconductor light-emitting device according to claim 1, wherein the p-type dopant concentration of the second p-type $Al_YGa_{1-Y}N$ layer is $1\times10^{20}$ $cm^{-3}$ or more, the p-type dopant concentration of the third p-type $Al_ZGa_{1-Z}N$ layer is in a range of $1\times10^{19}$ $cm^{-3}$ to $1\times10^{20}$ $cm^{-3}$, and the p-type dopant concentration of the first p-type $Al_XGa_{1-X}N$ layer is $1\times10^{20}$ $cm^{-3}$ or less.

13. The group III nitride semiconductor light-emitting device according to claim 1, wherein the second p-type $Al_YGa_{1-Y}N$ layer is made of GaN, and the first p-type $Al_XGa_{1-X}N$ layer is made of GaN.

14. The group III nitride semiconductor light-emitting device according to claim 1, wherein the second p-type $Al_YGa_{1-Y}N$ layer is made of GaN, and the third p-type $Al_ZGa_{1-Z}N$ layer is made of GaN.

15. The group III nitride semiconductor light-emitting device according to claim 1, wherein the first p-type $Al_XGa_{1-X}N$ layer is made of GaN, and the third p-type $Al_ZGa_{1-Z}N$ layer is made of GaN.

16. The group III nitride semiconductor light-emitting device according to claim 1, wherein the second p-type $Al_YGa_{1-Y}N$ layer is made of GaN, the first p-type $Al_XGa_{1-X}N$ layer is made of GaN, and the third p-type $Al_ZGa_{1-Z}N$ layer is made of GaN.

17. The group III nitride semiconductor light-emitting device according to claim 1, wherein the third p-type $Al_ZGa_{1-Z}N$ layer is in contact with the second p-type $Al_YGa_{1-Y}N$ layer.

18. The group III nitride semiconductor light-emitting device according to claim 1, wherein the p-type dopant concentration of the second p-type $Al_yGa_{1-y}N$ layer has a maximum, a p-type dopant concentration profile in the second p-type $Al_yGa_{1-y}N$ layer continuously decreasing from the maximum in a direction from the active layer towards the third p-type $Al_zGa_{1-z}N$ layer, and the third p-type $Al_zGa_{1-z}N$ layer is in physical contact with the second p-type $Al_yGa_{1-y}N$ layer.

* * * * *